United States Patent
Fujita et al.

(10) Patent No.: US 6,815,141 B2
(45) Date of Patent: Nov. 9, 2004

(54) ORGANIC LED DISPLAY PANEL PRODUCTION METHOD, ORGANIC LED DISPLAY PANEL PRODUCED BY THE METHOD, AND BASE FILM AND SUBSTRATE FOR USE IN THE METHOD

(75) Inventors: Yoshimasa Fujita, Nara (JP); Kimitaka Ohhata, Nara (JP)

(73) Assignee: Sharp Kabushiki Kaisha, Osaka (JP)

(*) Notice: Subject to any disclaimer, the term of this patent is extended or adjusted under 35 U.S.C. 154(b) by 46 days.

(21) Appl. No.: 10/146,464

(22) Filed: May 16, 2002

(65) Prior Publication Data

US 2003/0008224 A1 Jan. 9, 2003

(30) Foreign Application Priority Data

May 18, 2001 (JP) .................................... 2001-149502

(51) Int. Cl.⁷ .............................. G03F 7/34; G03F 7/09
(52) U.S. Cl. ..................................... 430/200; 430/201
(58) Field of Search ........................ 430/14, 200, 201

(56) References Cited

U.S. PATENT DOCUMENTS

| | | | | |
|---|---|---|---|---|
| 5,710,097 A | * | 1/1998 | Staral et al. | 430/200 |
| 5,725,989 A | * | 3/1998 | Chang et al. | 430/200 |
| 6,140,009 A | | 10/2000 | Wolk et al. | 430/200 |
| 6,221,553 B1 | * | 4/2001 | Wolk et al. | 430/200 |
| 2002/0187418 A1 | * | 12/2002 | Nakamura et al. | 430/200 |

FOREIGN PATENT DOCUMENTS

| | | | |
|---|---|---|---|
| EP | 851 714 | * | 7/1998 |
| JP | 08-227276 | | 9/1996 |
| JP | 10-012377 | | 1/1998 |
| JP | 10-208881 | | 8/1998 |
| JP | 11-237504 | | 8/1999 |
| JP | 11-260549 | | 9/1999 |
| WO | 00/41892 | | 7/2000 |
| WO | 00/41893 | | 7/2000 |

* cited by examiner

Primary Examiner—Richard L. Schilling
(74) Attorney, Agent, or Firm—Nixon & Vanderhye P.C.

(57) ABSTRACT

A method of producing an organic LED display panel, which includes: a step of preparing a donor film by forming a transfer film on a base film comprising at least a foundation film and a light-to-heat conversion layer and a step of combining the donor film with a substrate and irradiating the donor film with one of a light beam and a heat radiation beam to pattern-transfer the transfer film from the donor film onto the substrate, wherein surfaces of the base film and the substrate which are to be brought into contact with the transfer film are hydrophilic or hydrophobic, and have water contact angles $\theta_1$ and $\theta_2$, respectively, which satisfy the following expression (I):

$$\theta_1 - \theta_2 < 50 \text{ degrees} \qquad (I)$$

7 Claims, 2 Drawing Sheets

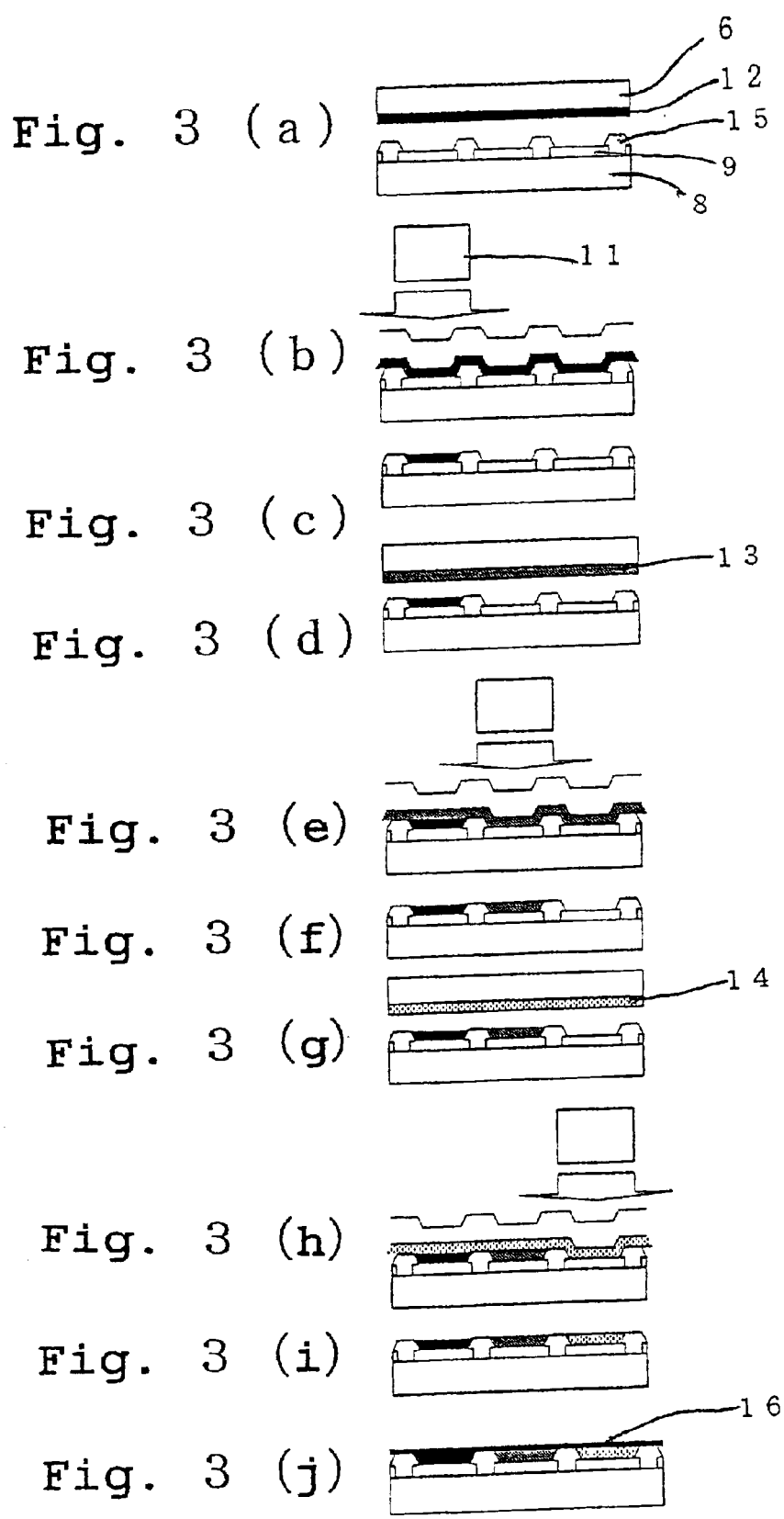

ORGANIC LED DISPLAY PANEL PRODUCTION METHOD, ORGANIC LED DISPLAY PANEL PRODUCED BY THE METHOD, AND BASE FILM AND SUBSTRATE FOR USE IN THE METHOD

CROSS-REFERENCE TO RELATED APPLICATION

This application is related to Japanese Patent Application No. 2001-149502 filed in May 18, 2001, whose priority is claimed under 35 USC §119, the disclosure of which is incorporated by reference in its entirety.

BACKGROUND OF THE INVENTION

1. Field of the Invention

The present invention relates to an organic LED display panel production method, an organic LED display panel produced by the method, and a base film and a substrate for use in the method.

2. Description of the Related Art

In recent years, intensive research and development have been conducted on techniques for patterning an organic LED layer for production of a full-color organic LED display panel. Exemplary patterning techniques hitherto proposed are a masked evaporation method (e.g., Japanese Unexamined Patent Publication No. 8-227276 (1996)) and an ink jet method (e.g., Japanese Unexamined Patent Publication No. 10-12377 (1998)).

With the masked evaporation method, however, it is very difficulty to produce LED devices on a greater size substrate. Further, the ink jet method requires much time for producing LED devices on a greater size substrate.

To cope with these problems, there have been proposed transfer methods (e.g., Japanese Unexamined Patent Publications No. 10-208881 (1998), No. 11-237504 (1999) and No. 11-260549 (1999)) as patterning methods which can significantly reduce the time required for production of LED devices on a greater size substrate.

In organic LED display panel production methods employing the prior-art transfer methods, a donor film having a transfer film (e.g., an organic layer) is brought into intimate contact with a substrate, and then a laser beam or a heat radiation beam is applied to a desired portion of the transfer film of the donor film to pattern-transfer the transfer film onto the substrate. However, the prior-art methods encounter a problem such that a portion of the transfer film not irradiated with the laser beam or the heat radiation beam is undesirably transferred onto the substrate. That is, the transfer film is incorrectly pattern-transferred onto a portion of the substrate other than the irradiated portion, resulting in a patterning failure.

SUMMARY OF THE INVENTION

In view of the foregoing, it is an object of the present invention to provide an organic LED display panel production method which prevents the patterning failure in the transfer process and ensures that an organic LED layer is correctly patterned by the transfer method. It is another object of the invention to provide an organic LED display panel produced by the organic LED display panel production method, and a base film and a substrate for use in the method.

In accordance with the present invention to achieve the aforesaid objects, there is provided an organic LED display panel production method comprising the steps of: preparing a donor film by forming a transfer film on a base film comprising at least a foundation film and a light-to-heat conversion layer (light absorbing layer); and combining the donor film with a substrate and irradiating the donor film with one of a light beam and a heat radiation beam to pattern-transfer the transfer film from the donor film onto the substrate, wherein surfaces of the base film and the substrate which are to be brought into contact with the transfer film are hydrophilic or hydrophobic, and have water contact angles $\theta_1$ and $\theta_2$, respectively, which satisfy the following expression (I):

$$\theta_1 - \theta_2 < 50 \text{ degrees} \tag{I}$$

The organic LED display panel production method may further comprise the step of subjecting at least one of the surface of the base film and the surface of the substrate to one of a hydrophilation treatment and a hydrophobation treatment so that the expression (I) is satisfied.

The hydrophilation treatment or the hydrophobation treatment is selected from the group consisting of a UV treatment, a plasma treatment, a corona treatment, an $F_2$ treatment and a chemical modification treatment.

Where the hydrophilation treatment or the hydrophobation treatment is the UV treatment, the UV treatment preferably employs a UV radiation having a wavelength of not greater than 310 nm.

Where the hydrophilation treatment or the hydrophobation treatment is the plasma treatment, the plasma treatment preferably employs argon or oxygen.

The present invention further provides an organic LED display panel produced by the organic LED display panel production method described above.

The present invention further provides a base film and a substrate for use in the organic LED display panel production method, the base film and the substrate being respectively composed of materials selected so that surfaces of the base film and the substrate to be brought into contact with the transfer film have water contact angles $\theta_1$ and $\theta_2$, respectively, which satisfy the expression (I) described above.

The present invention further provides a base film and a substrate for use in the organic LED display panel production method, the base film and the substrate having been subjected to one of a hydrophilation treatment and a hydrophobation treatment so that surfaces of the base film and the substrate to be brought into contact with the transfer film have water contact angles $\theta_1$ and $\theta_2$, respectively, which satisfy the expression (I) described above.

BRIEF DESCRIPTION OF THE DRAWINGS

FIGS. 3(a) to 3(j) are schematic sectional views for explaining formation of organic LED layers and a sealing film, according to an embodiment of present invention particularly, FIGS. 3(a) to 3(c) illustrating a red light emitting layer formation process, FIGS. 3(d) to 3(f) illustrating a green light emitting layer formation process, FIGS. 3(g) to 3(i) illustrating a blue light emitting layer formation process, and FIG. 3(j) illustrating a sealing film formation process.

DETAILED DESCRIPTION OF THE INVENTION

An organic LED display panel according to the present invention has substantially the same construction as a conventional organic LED display panel. More specifically, the inventive organic LED display panel comprises a plurality of pixels each constituted by an organic LED device which includes a first electrode, an organic LED layer (organic layer) comprised of at least one light emitting layer, and a second electrode which are stacked in this order. The organic LED display panel is produced by the following inventive method.

Figure 1:
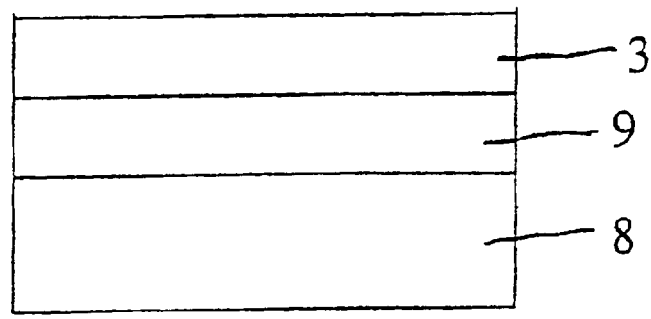
FIG. 1 is a schematic sectional view for explaining an organic LED display panel production method according to the present invention.
Figure 2:
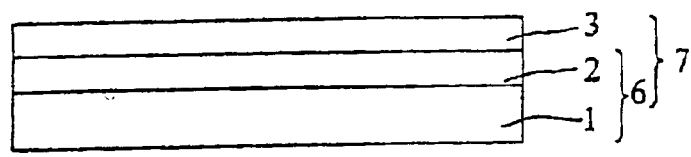
FIGS. 2(a) to 2(c) are fragmentary sectional views schematically illustrating donor films according to embodiments of the present invention.
Figure 2:
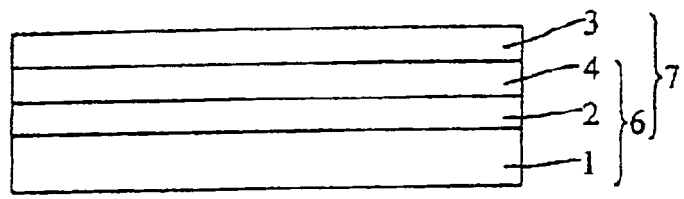
Figure 2:
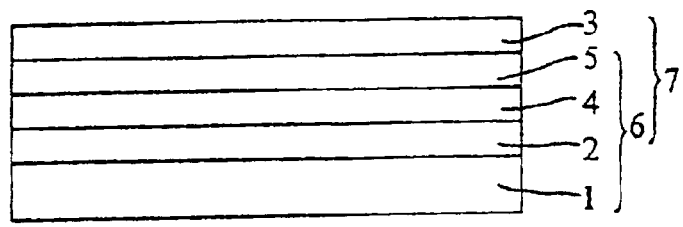

FIG. 1 is a sectional view for explaining the inventive organic LED display panel production method, and FIGS. 2(a) to 2(c) are schematic sectional views each illustrating a donor film according to the present invention. Referring to FIGS. 1 and 2(a), the inventive organic LED display panel production method comprises the steps of: performing a donor film preparation process by forming a transfer film 3 on a base film 6 having a foundation film 1 and a light-to-heat conversion layer 2 (light absorbing layer) for preparation of a donor film 7; and performing a transfer process by combining the donor film 7 with a substrate 8, pattern-transferring the transfer film 3 from the donor film 7 onto the substrate 8, and then removing the base film 6.

In the inventive organic LED display panel production method, the formation of the transfer film 3 on the base film 6 in the donor film preparation process is achieved by depositing an organic material on the base film 6 by a conventional dry or wet process. The method for the deposition of the organic material is not particularly limited.

Examples of the dry process include an evaporation method, an MBE method and an ion beam method, in which the organic material is directly deposited on the base film 6. Examples of the wet process include a spin coating method, a dip coating method, a micro-gravure coating method, an extrusion coating method, a spray coating method and an ink jet method, in which the organic material is dissolved or dispersed in a solvent and the resulting organic LED layer coating liquid is applied on the base film 6.

Referring again to FIGS. 1 and 2(a), an explanation will be given to the transfer process. As described above, the donor film 7 includes the transfer film 3 formed on the base film 6 in the donor film preparation process. On the other hand, the substrate 8 is preliminarily formed with a first electrode 9. The donor film 7 and the substrate 8 are combined together with the transfer film 3 and the first electrode 9 facing toward each other, and a light beam (e.g., a laser beam) or a heat radiation beam is applied onto the donor film 7 from the side of the base film 6 (or from the side of the foundation film 1) to pattern-transfer the transfer film 3 onto the substrate. Then, the base film 6 is peeled away with the transfer film 3 partly or entirely remaining on the substrate. Thus, the transfer process is completed. In this case, a second electrode (not shown) is incorporated in combination with an organic layer in the transfer film 3. As described above, the base film 6 includes at least the foundation film 1 and the light-to-heat conversion layer (light absorbing layer) 2. The transfer process is preferably performed in an inert gas atmosphere.

Although the first electrode 9 is preliminarily provided on the substrate 8 in the aforesaid transfer process, the first electrode 1 may be formed on the organic layer so as to be incorporated in the transfer film 3 after the organic layer of the transfer film 3 is formed on the base film 6. In FIG. 1, the second electrode is assumed to be incorporated in combination with the organic layer in the transfer film 3. However, where the second electrode is not incorporated in the transfer film 3, the second electrode may be formed on the transfer film 3 after the transfer of the transfer film 3. As described above, the first and second electrodes may optionally be incorporated in combination with the organic layer in the transfer film 3, depending on the case. Where the first or second electrode is incorporated in the transfer film, the first or second electrode in the transfer film may be used as it is or, alternatively, a metal film serving as the first or second electrode may further be provided on the transfer film.

The organic LED layer may have a single-layer structure or a multi-layer structure. Where the organic LED layer is of the multi-layer structure, the organic LED layer is formed, for example, in the following manner. Organic layers having different characteristic properties are separately formed as transfer films on different base films for preparation of donor films. For example, organic LED donor films are separately prepared by depositing a hole injecting material, a hole transporting material, a light emitting material and an electron transporting material on different base films. Then, the transfer process is repeatedly performed by employing these donor films. Thus, an organic LED layer of a multi-layer structure consisting of a plurality of organic sublayers is formed on the substrate.

Where a multi-color light emitting device is produced, organic LED donor films are separately prepared by forming an organic red light emitting multi-layer film (for example, having a hole transporting layer and a red light emitting layer), an organic green light emitting multi-layer film (for example, having a hole transporting layer and a green light emitting layer) and an organic blue light emitting multi-layer film (for example, having a hole transporting layer and a blue light emitting layer) as transfer films on different base films, and then the transfer process is repeatedly performed by employing these organic LED donor films. Thus, the multi-color light emitting device is produced which has the red, green and blue light emitting multi-layer films pattern-transferred onto a substrate thereof.

The inventive organic LED production method essentially includes the donor film preparation process and the transfer process. It is also essential that surfaces of the base film and the substrate to be brought into contact with the transfer film have water contact angles $\theta_1$ and $\theta_2$, respectively, which satisfy the following expression (I):

$$\theta_1 - \theta_2 < 50 \text{ degrees} \tag{I}$$

The following methods (1) to (5) are conceivable for satisfying the expression (I).

(1) Adhesion of the transfer film to the base film is increased by reducing the water contact angle $\theta_1$ of the surface of the base film to be brought into contact with the transfer film.

(2) Adhesion of the transfer film to the substrate is reduced by increasing the water contact angle $\theta_2$ of the surface of the substrate to be brought into contact with the transfer film.

(3) Adhesion of the transfer film to the base film is increased by reducing the water contact angle $\theta_1$ of the surface of the base film, to be brought into contact with the transfer film, and adhesion of the transfer film to the substrate is reduced by increasing the water contact angle $\theta_2$ of the surface of the substrate to be brought into contact with the transfer film.

(4) Adhesion of the transfer film to the base film is increased by reducing the water contact angle $\theta_1$ of the surface of the base film to be brought into contact with the transfer film, and adhesion of the transfer film to the substrate is increased by reducing the water contact angle $\theta_2$ of the surface of the substrate to be brought into contact with the transfer film.

(5) Adhesion of the transfer film to the base film is reduced by increasing the water contact angle $\theta_1$ of the surface of the base film to be brought into contact with the transfer film, and adhesion of the transfer film to the substrate is reduced by increasing the water contact angle $\theta_2$ of the surface of the substrate to be brought into contact with the transfer film.

To increase or reduce the water contact angle $\theta_1$ or $\theta_2$ of the surface of the base film or the substrate to be brought into contact with the transfer film, materials for the base film and the substrate are properly selected so that the expression (I) is satisfied, or the surface of the base film or the substrate is subjected to a hydrophilation treatment or a hydrophobation treatment. The latter case will be described more specifically. The base film or the substrate is formed of a conventional material, and then subjected to a UV treatment employing a UV radiation having a wavelength of not greater than 310 nm (preferably 100 nm to 310 nm), a plasma treatment employing argon gas, oxygen gas or $CF_4$ gas, a corona treatment in which a corona discharge is caused at a voltage of 100 to 20,000 V in an atmosphere of argon gas, oxygen gas or $CF_4$ gas, an $F_2$ treatment, or a chemical surface modification treatment employing glucosamide, a non-N-substituted amide, a methylamide or a dimethylamide. The time required for these treatments is merely about 30 minutes. In the present invention, the hydrophilation treatment and the hydrophobation treatment are not limited to the treatments described above.

Next, the components of the organic LED display panel will be described more specifically.

1. Donor Film

The donor film 7 typically includes the base film 6, and the transfer film 3 provided on the base film 6. The donor film 7 is also referred to as "light emitting layer donor film" or "light emitting pixel donor film", depending on the type of the transfer film 3.

FIGS. 2(a) to 2(c) schematically illustrate different types of donor films 7 in section. As shown in FIGS. 2(a) to 2(c), base films of the donor films 7 have different constructions. As described above, the donor film 7 shown in FIG. 2(a) includes the base film 6 having the foundation film 1 and the light-to-heat conversion layer 2, and the transfer film 3 provided on the base film 6. The donor film 7 shown in FIG. 2(b) includes a base film 6 having a foundation film 1, a light-to-heat conversion layer 2 and a heat conduction layer 4, and a transfer film 3 provided on the base film 6. The donor film 7 shown in FIG. 2(c) includes a base film 6 having a foundation film 1, a light-to-heat conversion layer 2, a heat conduction layer 4 and a gas generation layer 5, and a transfer film 3 provided on the base film 6.

2. Base Film

The base film 6 includes at least the foundation film 1 and the light-to-heat conversion layer (also referred to as "light absorbing layer") 2 provided on the foundation film 1 (see FIG. 2(a)). As described above, the base film 6 may further include the heat conduction layer 4 provided on the light-to-heat conversion layer 2 (see FIG. 2(b)). The base film 6 may further include the gas generation layer 5 (see FIG. 2(c)).

2-1. Foundation Film

The foundation film is formed of a transparent polymer film. Exemplary materials for the foundation film includes polycarbonates (PC), polyethylene terephthalates (PET), polyesters, polyacryls, epoxy resins, polyethylenes, polystyrenes and polyether sulfones, but not limited thereto. Among these materials, PC and PET are particularly preferred. The foundation film preferably has a thickness of 10 $\mu$m to 600 $\mu$m, more preferably 50 m to 200 $\mu$m.

2-2. Light-to-Heat Conversion Layer

The light-to-heat conversion layer (light absorbing layer) is composed of a material which absorbs a light beam and/or a heat radiation beam to efficiently generate heat. More specifically, the light-to-heat conversion layer may be a metal-based film such as an aluminum film, an aluminum oxide film and an aluminum sulfide film, or an organic film composed of a polymer material (e.g., thermosetting epoxy resin) containing carbon black, graphite or an infrared dye dispersed therein, but not limited thereto.

The metal-based film is formed by a known method such as a vacuum evaporation method, an electron beam evaporation method or a sputtering method, and preferably has a thickness of 50 Å to 10,000 Å, more preferably 100 Å to 5,000 Å.

The organic film is formed by a known coating method, and preferably has a thickness of 0.01 $\mu$m to 50 $\mu$m, more preferably 0.1 $\mu$m to 10 $\mu$m.

Where the light-to-heat conversion layer constitutes a surface layer of the base film, a surface of the light-to-heat conversion layer to be brought into contact with the transfer film should have a water contact angle $\theta_1$ which satisfies the aforesaid expression (I).

Exemplary polymer materials for the light-to-heat conversion layer to satisfy the expression (I) include polyvinyl alcohol (contact angle: 36 degrees), polyhydroxyethyl methacrylate (contact angle: 13 degrees) and polymethoxyethyl methacrylate (contact angle: 46 degrees).

Where a conventional polymer material is employed as the polymer material for the light-to-heat conversion layer, the surface of the light-to-heat conversion layer to be brought into contact with the transfer film is subjected to a UV treatment, a plasma treatment, a corona treatment, an $F_2$ treatment or a surface modification treatment, so that the water contact angle of the surface of the light-to-heat conversion layer is controlled to satisfy the aforesaid expression (I).

2-3. Heat Conduction Layer

The heat conduction layer (also referred to as "release layer") serves to conduct heat for efficient transfer of the transfer film. Exemplary materials for the heat conduction layer include polymer materials such as poly-$\alpha$-methylstyrene, but not limited thereto.

The heat conduction layer is formed by a known film formation method, and preferably has a thickness of 0.001 $\mu$m to 10 $\mu$m, more preferably 0.005 $\mu$m to 5 $\mu$m.

Where the heat conduction layer constitutes a surface layer of the base film, a surface of the heat conduction layer to be brought into contact with the transfer film has a water contact angle $\theta_1$ which satisfies the aforesaid expression (I).

Exemplary polymer materials for the heat conduction layer to satisfy the expression (I) include polyvinyl alcohol (contact angle: 36 degrees), polyhydroxyethyl methacrylate (contact angle: 13 degrees) and polymethoxyethyl methacrylate (contact angle: 46 degrees).

Where a conventional polymer material is employed as the polymer material for the heat conduction layer, the surface of the heat conduction layer to be brought into contact with the transfer film is subjected to a UV treatment, a plasma treatment, a corona treatment, an $F_2$ treatment or a surface modification treatment, so that the water contact angle of the surface of the heat conduction layer is controlled to satisfy the aforesaid expression (I).

2-4. Gas Generation Layer

The gas generation layer decomposes upon absorption of light or heat to generate nitrogen gas or hydrogen gas to provide energy for the transfer. That is, the gas generation layer contributes to improvement of the efficiency of the transfer.

Exemplary materials for the gas generation layer include polymer materials containing a gas generation substance such as pentaerythritol tetranitrate or nitrotoluene dispersed therein, but not limited thereto.

The gas generation layer is formed by a known film formation method, and preferably has a thickness of 0.001 $\mu$m to 10 $\mu$m, more preferably 0.005 $\mu$m to 5 $\mu$m.

Where the gas generation layer constitutes a surface layer of the base film, a surface of the gas generation layer to be brought into contact with the transfer film has a water contact angle $\theta_1$ which satisfies the aforesaid expression (I).

Exemplary polymer materials for the gas generation layer to satisfy the expression (I) include polyvinyl alcohol (contact angle: 36 degrees) and polyhydroxyethyl methacrylate (contact angle: 13 degrees).

Where a conventional polymer material is employed as the polymer material for the gas generation layer, the surface of the gas generation layer to be brought into contact with the transfer film is subjected to a UV treatment, a plasma treatment, a corona treatment, an $F_2$ treatment or a surface modification treatment, so that the water contact angle of the surface of the gas generation layer is controlled to satisfy the aforesaid expression (I).

3. Transfer Film

As described above, the transfer film is pattern-transferred onto the substrate in the transfer process. The transfer film may be constituted by an organic layer alone, or by the organic layer and an electrode layer (or electrode layers). Specific examples of the structure of the transfer film are as follows, but not limited thereto.

(1) Organic layer
(2) First electrode layer/Organic layer
(3) Organic layer/Second electrode layer
(4) First electrode layer/Organic layer/Second electrode layer The stacking order of the respective layers of the transfer film on the base film is not particularly limited.

3-1. Organic Layer

The organic layer may be of a single layer structure or of a multi-layer structure. Specific examples of the structure of the organic layer are as follows, but not limited thereto.

(1) Organic light emitting layer
(2) Hole transporting layer
(3) Electron transporting layer
(4) Hole injecting layer
(5) Hole transporting layer/Organic light emitting layer
(6) Hole injecting layer/Hole transporting layer
(7) Organic light emitting layer/Electron transporting layer
(8) Hole transporting layer/Organic light emitting layer/ Electron transporting layer
(9) Hole injecting layer/Hole transporting layer/Organic light emitting layer/Electron transporting layer
(10) Hole injecting layer/Hole transporting layer/Organic light emitting layer/Blocking layer/Electron transporting layer The organic light emitting layer may be of a single layer structure or of a multi-layer structure.

The organic light emitting layer is formed by a known dry process by employing a light emitting material optionally containing a light emitting assist agent, a charge transporting material and additives (a donor, an acceptor and the like) and a luminescent dopant. Examples of the dry process include a vacuum evaporation method, an EB method, an MBE method, a sputtering method and an OVPD method.

Alternatively, the organic light emitting layer may be formed by a known wet process by employing an organic light emitting layer coating liquid. The coating liquid contains at least one light emitting material dissolved or dispersed in a solvent and, optionally, a binder resin, a leveling agent, a light emitting assist agent, a charge injecting/ transporting material, additives (a donor, an acceptor and the like) and a luminescent dopant. Examples of the wet process include coating methods such as a spin coating method, a dip coating method, a doctor blade method, an extrusion coating method and a spray coating method, and printing methods such as ink jet method, a relief printing method, an intaglio printing method, a screen printing method and a microgravure coating method.

Known organic light emitting materials for organic LEDs are usable as the light emitting material. These organic light emitting materials are classified into low molecular light emitting materials, polymeric light emitting materials and precursors of the polymeric light emitting materials. Specific examples thereof are described below, but not limited thereto.

Examples of the low molecular light emitting materials include: fluorescent organic materials including aromatic dimethylidene compounds such as 4,4'-bis(2,2-diphenylvinyl)biphenyl (DPVBi), oxadiazole compounds such as 5-methyl-2-[2-[4-(5-methyl-2-benzoxazolyl)phenyl] vinyl]benzoxazole, triazole compounds such as 3-(4-biphenylyl)-4-phenyl-5-t-butylphenyl-1,2,4-triazole (TAZ), styrylbenzene compounds such as 1,4-bis(2-methylstyryl) benzene, thiopyrazine oxide derivatives, benzoquinone derivatives, naphthoquinone derivatives, anthraquinone derivatives, diphenoquinone derivatives and fluorenone derivatives; and fluorescent organometallic compounds such as azomethine zinc complexes and (8-hydroxyquinolinato) aluminum complexes ($Alq_3$)).

Examples of the polymeric light emitting materials include poly(2-decyloxy-1,4-phenylene) (DO-PPP), poly[2, 5-bis[2-(N,N,N-triethylammonium)ethoxy]-1,4-phenyl-alto-1,4-phenylene]dibromide (PPP-$NEt_3^+$), poly[2-(2'-ethylhexyloxy)-5-methoxy-1,4-phenylene vinylene] (MEH-PPV), poly[5-methoxy-(2-propanoxysulfonide)-1,4-phenylene vinylene] (MPS-PPV), poly[2,5-bis(hexyloxy)-1, 4-phenylene-(1-cyanovinylene)] (CN-PPV), and poly(9,9-dioctylfluorene) (PDAF).

Examples of the precursors of polymeric light emitting materials include a precursor of poly(p-phenylene vinylene) (Pre-PPV), a precursor of poly(p-naphthalene vinylene) (pre-PNV) and a precursor of poly(p-phenylene) (Pre-PPP).

Examples of the binder resin for the organic light emitting layer include polycarbonates and polyesters, but not limited thereto.

The solvent to be used for the formation of the organic light emitting layer is not particularly limited as long as the aforesaid light emitting material can be dissolved or dispersed therein. Specific examples thereof include pure water, methanol, ethanol, THF (tetrahydrofuran), chloroform, toluene, xylene, trimethylbenzene, triethylbenzene and tetramethylbenzene.

The hole transporting layer and the electron transporting layer (which will collectively be referred to as "charge transporting layer" in the following explanation) may be of a single layer structure or of a multi-layer structure.

The charge transporting layer is formed by a known dry process by employing a charge transporting material optionally containing additives (a donor, an acceptor and the like). Any of the aforesaid dry processes for the formation of the organic light emitting layer can be employed for the formation of the charge transporting layer.

Alternatively, the charge transporting layer may be formed by a known wet process by employing a charge transporting layer coating liquid. The coating liquid contains at least one charge transporting material dissolved or dispersed in a solvent and, optionally, a binder resin, a leveling agent and additives (a donor, an acceptor and the like). Any of the aforesaid wet processes for the formation of the organic light emitting layer can be employed for the formation of the charge transporting layer.

Known charge transporting materials for organic LEDs and organic light conductors are usable as the charge transporting material. These charge transporting materials are classified into hole transporting materials and electron transporting materials. Specific examples thereof are described below, but not limited thereto.

Examples of the hole transporting materials include: low molecular materials including inorganic p-type semiconductor materials, porphyrin compounds, aromatic tertiary amine compounds such as N,N'-bis(3-methylphenyl)-N,N'-bisphenyl-benzidine (TPD) and N,N'-di(naphthalene-1-yl)-N,N'-diphenyl-benzidine (NPD), hydrazone compounds, quinacridone compounds and styrylamine compounds; polymeric materials including polyaniline (PANI), 3,4-polyethylene dioxythiophene/polystyrene sulfonate (PEDOT/PSS), poly[triphenylamine derivative] (poly-TPD) and polyvinylcarbazole (PVCz); and precursors of polymeric materials such as a precursor of poly(p-phenylene vinylene) (Pre-PPV) and a precursor of poly(p-naphthalene vinylene) (Pre-PNV)).

Examples of the electron transporting materials include: low molecular materials including inorganic n-type semiconductor materials, oxadiazole derivatives, triazole derivatives, thiopyrazine oxide derivatives, benzoquinone derivatives, naphthoquinone derivatives, anthraquinone derivatives, diphenoquinone derivatives and fluorenone derivatives; and polymeric materials including polyoxadiazole (Poly-OXZ)).

Examples of the binder resin for the charge transporting layer include polycarbonates and polyesters, but not limited thereto.

The solvent to be used for the formation of the charge transporting layer is not particularly limited as long as the aforesaid charge transporting material can be dissolved or dispersed therein. Specific examples thereof include pure water, methanol, ethanol, THF, chloroform, xylene and trimethylbenzene.

The charge blocking layer may be of a single layer structure or of a multi-layer structure.

The charge blocking layer is formed by a known dry process by employing a charge blocking material optionally containing additives (a donor, an acceptor and the like). Any of the aforesaid dry processes for the formation of the organic light emitting layer can be employed for the formation of the charge blocking layer.

Alternatively, the charge blocking layer may be formed by a known wet process by employing a charge blocking layer coating liquid. The coating liquid contains at least one charge blocking material dissolved or dispersed in a solvent and, optionally, a binder resin and a leveling agent. Any of the aforesaid wet processes for the formation of the organic light emitting layer can be employed for the formation of the charge blocking layer.

Known charge blocking materials for organic LEDs are usable as the charge blocking material. Examples of the charge blocking materials include 4,7-diphenyl-1,10-phenanthroline, 2,9-dimethyl-1,10-phenanthroline and BAlq (bis(2-methyl-8-quinolinolate)(p-phenylphenolate) aluminum), but not limited thereto.

Examples of the binder resin for the charge blocking layer include polycarbonates and polyesters, but not limited thereto.

The solvent to be used for the formation of the charge blocking layer is not particularly limited as long as the aforesaid charge blocking material can be dissolved or dispersed therein. Specific examples thereof include pure water, methanol, ethanol, THF, chloroform, xylene and trimethylbenzene.

The aforesaid organic layers typically each have a thickness of about 1 nm to about 1,000 nm.

An atmosphere for the formation of the respective organic layers is not particularly limited, but an inert gas atmosphere or a vacuum atmosphere is preferred for prevention of absorption of moisture in the formed organic layers and deterioration of the employed organic materials.

Particularly, where the organic layers are formed by the wet process, the organic layers are preferably heat-dried for removal of a solvent residue. An atmosphere for the heat-drying is not particularly limited, but an inert gas atmosphere or a reduced pressure atmosphere is preferred for prevention of deterioration of the employed organic materials.

3-2. First and Second Electrodes

Known electrode materials may be employed as materials for the first and second electrodes. Exemplary anode materials include metals (e.g., Au, Pt and Ni) which have a higher work function, and transparent electrode materials (e.g., ITO, IDIXO and $SnO_2$). Exemplary cathode materials include materials which contain at least a metal having a lower work function (e.g., Ca, Ce, Cs, Ba, Al, Mg—Ag alloys and Li—Al alloys), and combination electrodes including a thin insulating layer and a metal electrode (e.g., LiF/Al). The first and second electrodes are formed by a know method such as an EB method, a sputtering method or a resistance heating evaporation method by employing any of the aforesaid electrode materials. The first and second electrodes typically each have a thickness of about 0.5 nm to about 1,000 nm.

Where the first or second electrode is to be brought into contact with the transfer film, the surface of the electrode is subjected to a UV treatment, a plasma treatment, a corona treatment, an $F_2$ treatment or a chemical surface modification treatment, so that the water contact angle of the surface of the electrode is controlled to satisfy the aforesaid expression (I).

4. Substrate

Examples of the substrate for use in the present invention include substrates of inorganic materials such as glass and quartz, substrates of plastics such as polyethylene terephthalates (PET), insulative substrates of ceramics such as alumina, metal substrates such as of aluminum and iron coated with insulative materials such as $SiO_2$ and organic insulative materials, and metal substrates such as of aluminum subjected to surface insulating treatments such as anodic oxidation, but not limited thereto.

Where a surface of the substrate is to be brought into direct contact with the transfer film, the surface of the substrate is subjected to a UV treatment, a plasma treatment, a corona treatment, an $F_2$ treatment or a chemical surface modification treatment, so that the water contact angle $\theta_2$ of the surface of the substrate is controlled to satisfy the aforesaid expression (I).

The substrate may be formed with switching devices such as thin film transistors.

Where polysilicon thin film transistors (TFTs) are to be formed in the substrate by a cold process, the substrate is preferably free from melting and distortion at temperatures not higher than 500° C. Where polysilicon thin film transistors (TFTs) are to be formed in the substrate by a hot process, the substrate is preferably free from melting and distortion at temperatures not higher than 1,000° C.

5. Polarization Plate

The inventive organic LED display panel preferably further includes a polarization plate. A conventional linear polarization plate and a ¼λ plate may be employed in combination as the polarization plate. This improves the contrast of the organic LED devices.

6. Sealing Film or Sealing Plate

The inventive organic LED display panel preferably further includes a sealing film or a sealing plate. The sealing film or the sealing plate may be formed of a conventional sealing material by a conventional sealing method. More specifically, the display panel is sealed with a glass or metal material with an inert gas such as nitrogen or argon gas filled therein. The inert gas may contain a moisture absorber such as barium oxide. The sealing method is not limited to the aforesaid method. Alternatively, the sealing film may be formed by spin-coating a resin directly on a counter electrode or bonding a resin film directly onto the counter electrode. The sealing film prevents external oxygen and moisture from intruding into the display panel to improve the service lives of the devices of the display panel.

7. Driving Method

The inventive organic LED display panel is driven by a conventional driving method such as a passive matrix driving method or an active matrix driving method. However, the driving method for the inventive organic LED display panel is not limited to the aforesaid driving methods.

EXAMPLES

The present invention will hereinafter be described more specifically by way of Examples and Comparative Examples. However, it should be understood that the invention be not limited to these examples.

Comparative Example 1

A 0. 1-mm thick polyethylene terephthalate (PET) film was prepared as a foundation film. A thermosetting epoxy resin containing carbon particles dispersed therein was deposited to a thickness of 5 μm on the foundation film, and solidified at a room temperature for formation of a light-to-heat conversion layer. Then, a 1-μm thick poly-α-methylstyrene film was formed as a heat conduction layer (release layer) on the light-to-heat conversion layer by a coating method. Thus, a base film was produced.

The wettability of a surface of the base film to be brought into contact with a transfer film was evaluated in the following manner. A water drop was applied on the surface of the base film, and the water contact angle $\theta_1$ of the surface of the base film was measured. The result is shown in Table 1.

TABLE 1

| | $\theta_1$ (degrees) | $\theta_2$ (degrees) | $\theta_1 - \theta_2$ (degrees) | Transfer of transfer Film on substrate |
|---|---|---|---|---|
| Comparative Example 1 | 55.6 | 3.2 | 52.4 | YES |
| Example 1 | 22.9 | 3.2 | 19.7 | NO |
| Example 2 | 17.5 | 3.2 | 14.3 | NO |
| Example 3 | 32.8 | 3.2 | 29.6 | NO |
| Example 4 | 20.6 | 3.2 | 17.4 | NO |
| Example 5 | 33.2 | 3.2 | 30.0 | NO |
| Example 6 | 21.2 | 3.2 | 18.0 | NO |
| Example 7 | 35.3 | 3.2 | 32.1 | NO |
| Example 8 | 30.9 | 3.2 | 27.7 | NO |
| Example 9 | 9.8 | 3.2 | 6.6 | NO |
| Example 10 | 7.2 | 3.2 | 4.0 | NO |
| Example 11 | 12.4 | 3.2 | 9.2 | NO |
| Example 12 | 11.1 | 3.2 | 7.9 | NO |
| Example 13 | 50.0 | 3.2 | 46.8 | NO |
| Example 14 | 55.6 | 46.6 | 9.0 | NO |
| Example 15 | 55.6 | 9.9 | 45.7 | NO |
| Example 16 | 9.8 | 9.9 | -0.1 | NO |

In turn, a light emitting layer coating liquid was prepared by dissolving 1 wt % of poly[2-methoxy-5-(2-ethylhexyloxy)-1,4-phenylene vinylene] (MEH-PPV) on a solid basis in tetrahydrofuran (THF). The coating liquid thus prepared had a viscosity of 2.8 cps. The light emitting layer coating liquid was applied onto the base film by means of a micro-gravure coater. Thus, a 50-nm thick light emitting layer was formed as a transfer film on the base film. The resulting film was heated in a high purity nitrogen atmosphere at 90° C. for 5 minutes for removal of the solvent from the transfer film. Thus, a light emitting layer donor film was produced.

An ITO transparent electrode (first electrode) was formed on a glass plate. A surface of the ITO transparent electrode to be brought into contact with the transfer film was cleaned with IPA (isopropyl alcohol) vapor for 5 minutes, and then irradiated with UV radiation having a wavelength of 172 nm for 15–30 minutes. Thus, a substrate was prepared. Then, the water contact angle $\theta_2$ of the substrate was measured. The water contact angle $\theta_2$ of the substrate and a difference $\theta_1 - \theta_2$ between the water contact angles $\theta_1$ and $\theta_2$ are also shown in Table 1. The light emitting layer donor film was combined with the substrate having the ITO transparent electrode subjected to the cleaning process, and pressed in intimate contact with the substrate by applying a load of 2 kg to the light emitting layer donor film once by means of a roller. Then, the donor film (base film) was peeled away from the substrate.

After the peeling, the surface of the substrate was inspected by means of an optical microscope and a fluorimetric microscope to check if the transfer film (light emitting layer) was transferred onto the transparent electrode of the substrate. The result is shown in Table 1.

Example 1

A base film was prepared in substantially the same manner as in Comparative Example 1, except that a surface of the base film was irradiated with a UV radiation having a wavelength of 172 nm for 5 minutes, and then the wettability of the base film was evaluated. A donor film was prepared in substantially the same manner as in Comparative Example 1 by employing the base film thus prepared. In turn, the donor film was pressed in intimate contact with a surface of a substrate and peeled away in the same manner as in Comparative Example 1, and then the surface of the substrate was inspected. The results are shown in Table 1.

Example 2

A base film was prepared in substantially the same manner as in Comparative Example 1, except that a surface of the base film was irradiated with a UV radiation having a wavelength of 172 nm for 15 minutes, and then the wettability of the base film was evaluated. A donor film was prepared in substantially the same manner as in Comparative Example 1 by employing the base film thus prepared. In turn, the donor film was pressed in intimate contact with a surface of a substrate and peeled away in the same manner as in Comparative Example 1, and then the surface of the substrate was inspected. The results are shown in Table 1.

Example 3

A base film was prepared in substantially the same manner as in Comparative Example 1, except that a surface of the base film was irradiated with a UV radiation having a wavelength of 222 nm for 5 minutes, and then the wettability of the base film was evaluated. A donor film was prepared in substantially the same manner as in Comparative Example 1 by employing the base film thus prepared. In turn, the donor film was pressed in intimate contact with a surface of a substrate and peeled away in the same manner as in Comparative Example 1, and then the surface of the substrate was inspected. The results are shown in Table 1.

Example 4

A base film was prepared in substantially the same manner as in Comparative Example 1, except that a surface of the base film was irradiated with a UV radiation having a wavelength of 222 nm for 15 minutes, and then the wettability of the base film was evaluated. A donor film was prepared in substantially the same manner as in Comparative Example 1 by employing the base film thus prepared. In turn, the donor film was pressed in intimate contact with a surface of a substrate and peeled away in the same manner as in Comparative Example 1, and then the surface of the substrate was inspected. The results are shown in Table 1.

Example 5

A base film was prepared in substantially the same manner as in Comparative Example 1, except that a surface of the base film was irradiated with a UV radiation having a wavelength of 308 nm for 5 minutes, and then the wettability of the base film was evaluated. A donor film was prepared in substantially the same manner as in Comparative Example 1 by employing the base film thus prepared. In turn, the donor film was pressed in intimate contact with a surface of a substrate and peeled away in the same manner as in Comparative Example 1, and then the surface of the substrate was inspected. The results are shown in Table 1.

Example 6

A base film was prepared in substantially the same manner as in Comparative Example 1, except that a surface of the base film was irradiated with a UV radiation having a wavelength of 308 nm for 15 minutes, and then the wettability of the base film was evaluated. A donor film was prepared in substantially the same manner as in Comparative Example 1 by employing the base film thus prepared. In turn, the donor film was pressed in intimate contact with a surface of a substrate and peeled away in the same manner as in Comparative Example 1, and then the surface of the substrate was inspected. The results are shown in Table 1.

Example 7

A base film was prepared in substantially the same manner as in Comparative Example 1, except that a surface of the base film was subjected to a corona treatment in an oxygen gas atmosphere at a voltage of 5,000 V for 5 minutes, and then the wettability of the base film was evaluated. A donor film was prepared in substantially the same manner as in Comparative Example 1 by employing the base film thus prepared. In turn, the donor film was pressed in intimate contact with a surface of a substrate and peeled away in the same manner as in Comparative Example 1, and then the surface of the substrate was inspected. The results are shown in Table 1.

Example 8

A base film was prepared in substantially the same manner as in Comparative Example 1, except that a surface of the base film was subjected to a corona treatment in an oxygen gas atmosphere at a voltage of 5,000 V for 15 minutes, and then the wettability of the base film was evaluated. A donor film was prepared in substantially the same manner as in Comparative Example 1 by employing the base film thus prepared. In turn, the donor film was pressed in intimate contact with a surface of a substrate and peeled away in the same manner as in Comparative Example 1, and then the surface of the substrate was inspected. The results are shown in Table 1.

Example 9

A base film was prepared in substantially the same manner as in Comparative Example 1, except that a surface of the base film was subjected to an Ar plasma treatment in an Ar gas atmosphere at a vacuum degree of $4 \times 10^{-1}$ torr with a power of 100 W for 5 minutes, and then the wettability of the base film was evaluated. A donor film was prepared in substantially the same manner as in Comparative Example 1 by employing the base film thus prepared. In turn, the donor film was pressed in intimate contact with a surface of a substrate and peeled away in the same manner as in Comparative Example 1, and then the surface of the substrate was inspected. The results are shown in Table 1.

Example 10

A base film was prepared in substantially the same manner as in Comparative Example 1, except that a surface of the base film was subjected to an $O_2$ plasma treatment in an $O_2$ gas atmosphere at a vacuum degree of $4 \times 10^{-1}$ torr with a power of 100 W for 5 minutes, and then the wettability of the base film was evaluated. A donor film was prepared in substantially the same manner as in Comparative Example 1 by employing the base film thus prepared. The donor film was pressed in intimate contact with a surface of a substrate and peeled away in the same manner as in Comparative Example 1, and then the surface of the substrate was inspected. The results are shown in Table 1.

Example 11

A base film was prepared in substantially the same manner as in Comparative Example 1, except that a surface of the base film was subjected to a $CF_4$ plasma treatment in a $CF_4$ gas atmosphere at a vacuum degree of $4 \times 10^{-1}$ torr with a power of 100 W for 5 minutes, and then the wettability of the base film was evaluated. A donor film was prepared in substantially the same manner as in Comparative Example 1 by employing the base film thus prepared. In turn, the donor film was pressed in intimate contact with a surface of a substrate and peeled away in the same manner as in Comparative Example 1, and then the surface of the substrate was inspected. The results are shown in Table 1.

Example 12

A base film was prepared in substantially the same manner as in Comparative Example 1, except that a surface of the base film was modified by glucosamide, and then the wettability of the base film was evaluated. A donor film was prepared in substantially the same manner as in Comparative Example 1 by employing the base film thus prepared. In turn, the donor film was pressed in intimate contact with a surface of a substrate and peeled away in the same manner as in Comparative Example 1, and then the surface of the substrate was inspected. The results are shown in Table 1. It is noted that the surface modification of the base film with glucosamide was achieved by immersing the base film in a glucosamide solution.

Example 13

A base film was prepared in substantially the same manner as in Comparative Example 1, except that the heat conduction layer was formed of polymethoxyethyl methacrylate, and then the wettability of the base film was evaluated. A donor film was prepared in substantially the same manner as in Comparative Example 1 by employing the base film thus prepared. In turn, the donor film was pressed in intimate contact with a surface of a substrate and peeled away in the same manner as in Comparative Example 1, and then the surface of the substrate was inspected. The results are shown in Table 1.

Example 14

A base film was prepared in the same manner as in Comparative Example 1, and then the wettability of the base film was evaluated. A donor film was prepared in the same manner as in Comparative Example 1 by employing the base film thus prepared. A substrate was prepared in substantially the same manner as in Comparative Example 1, except that the surface of the ITO transparent electrode was cleaned with IPA vapor for 5 minutes but not irradiated with the UV radiation, and the wettability of the substrate was evaluated. In turn, the donor film was pressed in intimate contact with the substrate and peeled away in the same manner as in Comparative Example 1, and then the surface of the substrate was inspected. The results are shown in Table 1.

Example 15

A base film was prepared in the same manner as in Comparative Example 1, and then the wettability of the base film was evaluated. A donor film was prepared in the same manner as in Comparative Example 1 by employing the base film thus prepared. A substrate was prepared in substantially the same manner as in Comparative Example 1, except that the surface of the ITO transparent electrode was cleaned with IPA vapor for 5 minutes and subjected to an $O_2$ plasma treatment in an $O_2$ gas atmosphere at a vacuum degree of $4 \times 10^{-1}$ torr with a power of 100 W for 5 minutes, and the wettability of the substrate was evaluated. In turn, the donor film was pressed in intimate contact with the substrate and peeled away in the same manner as in Comparative Example 1, and then the surface of the substrate was inspected. The results are shown in Table 1.

Example 16

A base film was prepared in substantially the same manner as in Comparative Example 1, except that a surface of the base film was subjected to an Ar plasma treatment for 5 minutes in the same manner as in Example 9, and then the wettability of the base film was evaluated. A donor film was prepared in substantially the same manner as in Comparative Example 1 by employing the base film thus prepared. A substrate was prepared in substantially the same manner as in Comparative Example 1, except that the surface of the ITO transparent electrode was cleaned with IPA vapor for 5 minutes and subjected to an $O_2$ plasma treatment for 5 minutes in the same manner as in Example 15, and then the wettability of the substrate was evaluated. In turn, the donor film was pressed in intimate contact with the substrate and peeled away in the same manner as in Comparative Example 1, and then the surface of the substrate was inspected. The results are shown in Table 1.

As can be understood from the results shown in Table 1, the transfer film of the donor film was not transferred onto the substrate simply by pressing the donor film in intimate contact with the substrate in Examples 1 to 16 where the difference $\theta_1 - \theta_2$ between the water contact angle $\theta_1$ of the base film and the water contact angle $\theta_2$ of the substrate was not greater than 50 degrees. In Comparative Example 1 where the difference $\theta_1 - \theta_2$ between the water contact angle $\theta_1$ of the base film and the water contact angle $\theta_2$ of the substrate was greater than 50 degrees, the transfer film was transferred onto the substrate simply by pressing the donor film in intimate contact with the substrate. More specifically, where a laser beam or a heat radiation beam is applied to a desired portion of the donor film brought into intimate contact with the substrate, a portion of the transfer film not irradiated with the laser beam or the heat radiation beam is not transferred onto the substrate in the former case, but transferred onto the substrate in the latter case.

Example 17

Preparation of TFT Substrate

A 50-nm thick α-Si film was formed on a glass plate (having a thickness of 1.1 mm (±10%), a resistance of $>10^{14}$ Ω·cm and a distortion point of 667° C.) by decomposing $Si_2H_6$ by an LP-CVD method, and then polycrystallized by excimer laser annealing for formation of a polysilicon (Poly-Si) film. In turn, the Poly-Si film was etched for formation of channel portions and source/drain portions, and then a 50-nm thick gate insulating film of $SiO_2$ was formed on the resulting substrate. Thereafter, a 100-nm thick Al film was formed on the gate insulating film by a sputtering method and patterned for formation of gate electrodes. At this time, lower electrodes of capacitors were also formed. In turn, side faces of the gate electrodes were subjected to anodic oxidization for formation of offset portions, and the source/drain portions were doped with phosphorus in a high concentration by an ion implantation method. Subsequently, formation of scanning lines and formation of source/drain electrodes and common electrodes were carried out, followed by formation of upper electrodes of the capacitors. Thus, Poly-Si TFTs were formed by a cold process.

In turn, a 3-μm thick $SiO_2$ film was formed as an insulation film (planarization film) on the resulting substrate. A resist was applied on the insulation film, and a resist pattern was formed as having openings in contact hole-formation regions by a photolithography method. With the use of the resist pattern, the insulation film was etched to be formed with contact holes, and then the resist pattern was washed away.

Then, aluminum was deposited to a thickness of 4 μm on the insulation film formed with the contact holes. The resulting aluminum film was polished away, whereby interconnections were formed in the contact holes and, at the same time, the surface of the insulation film and surfaces of the interconnections were planarized.

Thereafter, aluminum was deposited again to a thickness of 150 nm on the planarized insulation film by a sputtering method so as to be electrically connected to the drain electrodes via the interconnections formed in the contact holes. For the sputtering, the substrate was kept at 300° C. Subsequently, the resulting aluminum film was etched to be patterned for formation of pixel electrodes. Then, 1-nm thick LiF cathodes were formed on the resulting substrate.

In turn, a 200-nm thick $SiO_2$ film was formed as an insulation film on the resulting substrate, and a resist was applied on the $SiO_2$ film and patterned into a predetermined configuration. With the use of the resulting resist pattern, the $SiO_2$ film was dry-etched for formation of tapered insulation films between the pixel electrodes. Thus, degradation of devices is prevented, which may otherwise occur due to field concentration at edges of the pixel electrodes. When organic LED layers are formed, the tapered $SiO_2$ insulation films prevent the transfer failure of the organic LED layers because a donor film is assuredly brought into intimate contact with the substrate.

Next, the preparation of donor films for formation of red, green, blue light emitting pixels, the pattern transfer of the donor films, the formation of a counter electrode and the formation of a sealing film were carried out in the following manner in an inert gas atmosphere or a vacuum atmosphere for prevention of degradation of the organic layers and the electrodes. FIGS. 3(a) to 3(j) are schematic sectional views for explaining formation of the organic LED layers and the sealing film.

FIGS. 3(a) to 3(c) illustrate a red light emitting layer formation process. Particularly, FIG. 3(a) illustrates a state immediately before a donor film having a red light emitting layer formed on a base film thereof is combined with the substrate. FIG. 3(b) illustrates the step of pattern-transferring the red light emitting layer. FIG. 3(c) illustrates a state after completion of the pattern-transfer of the red light emitting layer. FIGS. 3(d) to 3(f) illustrate a green light emitting layer formation process. Particularly, FIG. 3(d) illustrates a state immediately before a donor film having a green light emitting layer formed on a base film thereof is combined with the substrate. FIG. 3(e) illustrates the step of pattern-transferring the green light emitting layer. FIG. 3(f) illustrates a state after completion of the pattern-transfer of the green light emitting layer. FIGS. 3(g) to 3(i) illustrate a blue light emitting layer formation process. Particularly, FIG. 3(g) illustrates a state immediately before a donor film having a blue light emitting layer formed on a base film thereof is combined with the substrate. FIG. 3(h) illustrates the step of pattern-transferring the blue light emitting layer. FIG. 3(i) illustrates a state after completion of the pattern-transfer of the blue light emitting layer. FIG. 3(j) illustrates the step of forming the sealing film after the transfer process for completion of the organic LED display panel.

In FIGS. 3(a) to 3(j), the base film, the substrate and the first electrode are denoted by reference numerals 6, 8 and 9, respectively. Further, the red light emitting layer, the green light emitting layer, the blue light emitting layer and the sealing film are denoted by reference numerals 12, 13, 14 and 16, respectively. Reference numerals 11 and 15 denote a YAG laser and barrier ribs, respectively.

Preparation of Base Film

A 0.1-mm thick polyethylene terephthalate (PET) film was prepared as a foundation film. A thermosetting epoxy resin containing carbon particles dispersed therein was deposited to a thickness of 5 μm on the foundation film, and solidified at a room temperature for formation of a light-to-heat conversion layer. Then, a 1-μm thick poly-α-methylstyrene film was formed as a heat conduction layer (release layer) on the light-to-heat conversion layer by a coating method. In this manner, base films were prepared for red, green and blue light emitting pixel donor films.

Surfaces of the base films were each treated in the same manner as in Example 1. The surfaces of the base films each have a water contact angle $θ_1$ of 22.9 degrees.

Preparation of Red Light Emitting Pixel Donor Film

A hole transporting layer coating liquid was prepared by dissolving 1 wt % of 3,4-polyethylene dioxythiophene/polystyrene sulfonate (PEDOT/PSS) on a solid basis in pure water. The coating liquid thus prepared had a viscosity of 4.6 cps. The hole transporting layer coating liquid was applied on the base film by means of a micro-gravure coater for formation of a 50-nm thick hole transporting layer. Then, the resulting base film was heated in a high purity nitrogen atmosphere at 110° C. for 5 minutes for removal of the solvent from the hole transporting layer.

In turn, a red light emitting layer coating liquid was prepared by dissolving 2 wt % of poly[2,5-bis(hexyloxy)-1,4-phenylene-(1-cyanovinylene)] (CN-PPV) on a solid basis in chloroform. The coating liquid thus prepared had a viscosity of 2.6 cps. The red light emitting layer coating liquid was applied on the hole transporting layer formed on the base film by means of a micro-gravure coater for formation of a 75-nm thick red light emitting layer. Then, the resulting base film was heated in a high purity nitrogen atmosphere at 110° C. for 5 minutes for removal of the solvent from the red light emitting layer. Thus, the red light emitting pixel donor film was prepared, which had a transfer film constituted by the hole transporting layer and the red light emitting layer (FIG. 3(a)).

Preparation of Green Light Emitting Pixel Donor Film

A hole transporting layer was formed on the base film in the same manner as in the preparation of the red light emitting pixel donor film.

Then, a green light emitting layer coating liquid was prepared by dissolving 2 wt % of a precursor of poly(p-phenylene vinylene) (Pre-PPV) on a solid basis in methanol. The coating liquid thus prepared had a viscosity of 3.6 cps. The green light emitting layer coating liquid was applied on the hole transporting layer formed on the base film by means of a micro-gravure coater for formation of a 75-nm thick green light emitting layer. Then, the resulting base film was heated in a high purity nitrogen atmosphere at 110° C. for 5 minutes for removal of the solvent from the green light emitting layer and for conversion of Pre-PPV into PPV. Thus, the green light emitting pixel donor film was prepared, which had a transfer film constituted by the hole transporting layer, and the green light emitting layer (FIG. 3(d)).

Preparation of Blue Light Emitting Pixel Donor Film

A hole transporting layer was formed on the base film in the same manner as in the preparation of the red light emitting pixel donor film.

Then, a blue light emitting layer coating liquid was prepared by dissolving 1 wt % of poly(9,9-dioctylfluorene) (PDAF) on a solid basis in xylene. The coating liquid thus prepared had a viscosity of 6.6 cps. The blue light emitting layer coating liquid was applied on the hole transporting layer formed on the base film by means of a micro-gravure coater for formation of a 75-nm thick blue light emitting layer. Then, the resulting base film was heated in a high purity nitrogen atmosphere at 110° C. for 5 minutes for removal of the solvent from the blue light emitting layer. Thus, the blue light emitting pixel donor film was prepared, which had a transfer film constituted by the hole transporting layer and the blue light emitting layer (FIG. 3(g)).

Pattern Transfer

The surface of the substrate formed with the Poly-Si TFTs on which the transfer films are to be pattern-transferred was treated in the same manner as in Example 15. The surface of the substrate thus treated had a water contact angle θ2 of 9.9 degrees. The red light emitting pixel donor film was brought into intimate contact with the treated surface of the substrate, and a 13-W YAG laser was scanned in a predetermined pattern over the red light emitting pixel donor film (FIG. 3(b)). Then, the base film was peeled away from the substrate. Thus, the transfer film of the red light emitting pixel donor film was pattern-transferred onto the substrate, whereby red light emitting pixels were formed (FIG. 3(c)).

Similarly, the transfer films of the green light emitting pixel donor film and the blue light emitting pixel donor film were pattern-transferred onto the substrate formed with the Poly-Si TFTs, whereby green light emitting pixels and blue light emitting pixels were formed (FIGS. 3(e) and 3(f), and FIGS. 3(h) and 3(i)).

Formation of Anodes and Sealing Film

The resulting substrate was heat-dried in vacuum at 100° C. for 30 minutes so that moisture adsorbed on the organic films was completely removed. Then, the substrate was fixed in a sputtering apparatus, while being kept in vacuum. Then, IDIXO was deposited to a thickness of 200 nm on the substrate by a vacuum evaporation method for formation of anodes. An epoxy resin was spread to a thickness of 1 μm over the anodes by a spin-coating method for formation of a sealing film (FIG. 3(j)). Thus, an organic LED display panel was produced.

A driving circuit was connected to the organic LED display panel thus produced, and a power supply was connected to signal lines of the display panel. When operation signals were sequentially applied to the scanning lines of the display panel, light emission from the pixels was observed without luminous inconsistency.

According to the present invention, the organic LED display panel is produced by preparing the donor film by forming the transfer film on the base film having at least the foundation film and the light-to-heat conversion layer (light absorbing layer), combining the donor film with the substrate, and pattern-transferring the transfer film from the donor film onto the substrate. Since the water contact angles $θ_1$ and $θ_2$ of the surfaces of the base film and the substrate to be brought into contact with the transfer film satisfy the aforesaid expression (I), a portion of the transfer film not irradiated with a laser beam or a heat radiation beam is prevented from being transferred onto the substrate, and the organic LED layer is correctly patterned by the transfer method.

What is claimed is:

1. A method of producing an organic LED display panel, the method comprising:

preparing a donor film by forming a transfer film on a base film comprising at least a foundation film and a light-to-heat conversion layer, combining the donor film with a substrate and irradiating the donor film with one of a light beam and a heat radiation beam to pattern-transfer the transfer film from the donor film onto the substrate, wherein surfaces of the base film and the substrate which are to be brought into contact with the transfer film are hydrophilic or hydrophobic, and have water contact angles $θ_1$ and $θ_2$, respectively, which satisfy the following expression (I):

$$θ_1 - θ_2 < 50 \text{ degrees}$$

subjecting at least one of the surface of the base film and the surface of the substrate to one of a hydrophilation treatment and a hydrophobation treatment so that the expression (I) is satisfied.

2. A method of producing an organic LED display panel as defined in claim 1, wherein the hydrophilation treatment or the hydrophobation treatment is selected from the group consisting of a UV treatment, a plasma treatment, a corona treatment, an $F_2$ treatment and a chemical modification treatment.

3. A method of producing an organic LED display panel as defined in claim 1, wherein the hydrophilation treatment or the hydrophobation treatment further comprises UV treatment which employs a UV radiation having a wavelength of not greater than 310 nm.

4. A method of producing an organic LED display panel as defined in claim 1, wherein the hydrophilation treatment or the hydrophobation treatment further comprises plasma treatment which employs argon and/or oxygen.

5. The method of claim 1, wherein the substrate comprises an electrode supported by at least a glass, quartz or polymer inclusive support layer, and wherein the surface of the substrate to be brought into contact with the transfer film comprises a surface of the electrode.

6. A method of producing an organic LED display panel, the method comprising:

preparing a donor film by forming a transfer film on a base film comprising at least a foundation film and a light-to-heat conversion layer, coupling the donor film with a substrate and irradiating the donor film with at least one of a light beam and a heat radiation beam to pattern-transfer the transfer film from the donor film onto the substrate, wherein surfaces of the base film and the substrate which are to be brought into contact with the transfer film have water contact angles $θ_1$ and $θ_2$, respectively, which satisfy the following expression (I):

$$θ_1 - θ_2 < 50 \text{ degrees}$$

subjecting at least one of the surface of the base film and the surface of the substrate to hydrophilation treatment and/or hydrophobation treatment so that the expression (I) is satisfied.

7. The method of claim 6, wherein the substrate comprises an electrode supported by at least a glass, quartz or polymer inclusive support layer, and wherein the surface of the substrate to be brought into contact with the transfer film comprises a surface of the electrode.

* * * * *